(12) United States Patent
Song et al.

(10) Patent No.: US 6,620,670 B2
(45) Date of Patent: Sep. 16, 2003

(54) PROCESS CONDITIONS AND PRECURSORS FOR ATOMIC LAYER DEPOSITION (ALD) OF $AL_2O_3$

(75) Inventors: Kevin Song, San Jose, CA (US); Jallepally Ravi, Santa Clara, CA (US); Shih-Hung Li, Sunnyvale, CA (US); Liang-Yuh Chen, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/053,009

(22) Filed: Jan. 18, 2002

(65) Prior Publication Data

US 2003/0139005 A1 Jul. 24, 2003

(51) Int. Cl.$^7$ .......................................... H01L 21/8238
(52) U.S. Cl. ........................................ 438/216; 257/410
(58) Field of Search ................................ 438/240, 216; 257/310, 410

(56) References Cited

U.S. PATENT DOCUMENTS

| | | | | |
|---|---|---|---|---|
| 4,486,487 A | 12/1984 | Skarp | ......................... | 428/216 |
| 4,813,846 A | 3/1989 | Helms | ..................... | 414/744.1 |
| 4,829,022 A | 5/1989 | Kobayashi et al. | ......... | 437/107 |
| 4,834,831 A | 5/1989 | Nishizawa et al. | ......... | 156/611 |
| 4,838,983 A | 6/1989 | Schumaker et al. | ........ | 156/613 |
| 4,838,993 A | 6/1989 | Aoki et al. | ................... | 156/643 |
| 4,859,625 A | 8/1989 | Nishizawa et al. | ........... | 437/81 |
| 4,917,556 A | 4/1990 | Stark et al. | ................. | 414/217 |
| 4,927,670 A | 5/1990 | Erbil | ....................... | 427/255.3 |
| 4,931,132 A | 6/1990 | Aspnes et al. | .............. | 156/601 |
| 4,951,601 A | 8/1990 | Maydan et al. | ............. | 118/719 |
| 4,960,720 A | 10/1990 | Shimbo | ....................... | 437/105 |
| 4,975,252 A | 12/1990 | Nishizawa et al. | .......... | 422/245 |
| 5,000,113 A | 3/1991 | Wang et al. | ................. | 118/723 |
| 5,013,683 A | 5/1991 | Petroff et al. | ............... | 437/110 |
| 5,028,565 A | 7/1991 | Chang et al. | ................ | 437/192 |
| 5,085,885 A | 2/1992 | Foley et al. | .................... | 477/38 |
| 5,091,320 A | 2/1992 | Aspnes et al. | ................. | 437/8 |
| 5,173,474 A | 12/1992 | Connell et al. | ................. | 505/1 |
| 5,186,718 A | 2/1993 | Tepman et al. | ............ | 29/25.01 |
| 5,205,077 A | 4/1993 | Wittstock | ................. | 51/165 R |

(List continued on next page.)

FOREIGN PATENT DOCUMENTS

| | | | | |
|---|---|---|---|---|
| DE | 196 27 017 | 1/1997 | ......... | H01L/21/283 |
| DE | 198 20 147 | 7/1999 | ....... | H01L/21/3205 |
| EP | 0 344 352 A1 | 12/1989 | ........... | H01L/39/24 |

(List continued on next page.)

OTHER PUBLICATIONS

Hultman, et al., "Review of the thermal and mechanical stability of TiN–based thin films", *Zeitschrift Fur Metallkunde,* 90(10) (Oct. 1999), pp. 803–813.

(List continued on next page.)

*Primary Examiner*—David Nelms
*Assistant Examiner*—Tu-Tu Ho
(74) *Attorney, Agent, or Firm*—Moser, Patterson & Sheridan L.L.P.

(57) ABSTRACT

A semiconductor processing chamber has been utilized to perform sequential deposition of high-K $Al_2O_3$ thin films on a substrate disposed in the chamber employing low viscosity precursors. The method commences with introduction of an aluminum precursor into the processing chamber. In this manner, a monolayer of aluminum precursor is chemisorbed onto the substrate surface. Thereafter, non-chemisorbed aluminum precursor is purged from the processing chamber, followed by introduction of an oxygen precursor. The oxygen precursor reacts with the chemisorbed layer, resulting in a monolayer of $Al_2O_3$. Finally, excess oxygen precursor and by-products of the reaction are purged completing the sequential deposition cycle. The sequential deposition cycle can be repeated to grow the $Al_2O_3$ film to a desired thickness.

21 Claims, 8 Drawing Sheets

U.S. PATENT DOCUMENTS

| | | | |
|---|---|---|---|
| 5,234,561 A | 8/1993 | Randhawa et al. | 204/192.38 |
| 5,246,536 A | 9/1993 | Nishizawa et al. | 156/610 |
| 5,254,207 A | 10/1993 | Nishizawa et al. | 156/601 |
| 5,259,881 A | 11/1993 | Edwards et al. | 118/719 |
| 5,277,788 A * | 1/1994 | Nitowski et al. | 205/172 |
| 5,286,296 A | 2/1994 | Sato et al. | 118/719 |
| 5,296,403 A | 3/1994 | Nishizawa et al. | 437/133 |
| 5,311,055 A | 5/1994 | Goodman et al. | 257/593 |
| 5,316,615 A | 5/1994 | Copel | 117/95 |
| 5,348,911 A | 9/1994 | Jurgensen et al. | 117/91 |
| 5,438,952 A | 8/1995 | Otsuka | 117/84 |
| 5,439,876 A | 8/1995 | Graf et al. | 505/447 |
| 5,441,703 A | 8/1995 | Jurgensen | 422/129 |
| 5,455,072 A | 10/1995 | Bension et al. | 427/255.7 |
| 5,469,806 A | 11/1995 | Mochizuki et al. | 117/97 |
| 5,492,606 A * | 2/1996 | Stauder et al. | 204/192.12 |
| 5,503,875 A | 4/1996 | Imai et al. | 427/255.3 |
| 5,521,126 A | 5/1996 | Okamura et al. | 437/235 |
| 5,527,733 A | 6/1996 | Nishizawa et al. | 437/160 |
| 5,540,783 A | 7/1996 | Eres et al. | 118/725 |
| 5,580,380 A | 12/1996 | Liu et al. | 117/86 |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 ER |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | 437/225 |
| 5,695,564 A | 12/1997 | Imahashi | 118/719 |
| 5,707,880 A | 1/1998 | Aftergut et al. | 437/3 |
| 5,730,801 A | 3/1998 | Tepman et al. | 118/719 |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | 257/66 |
| 5,801,634 A | 9/1998 | Young et al. | 340/635 |
| 5,807,792 A | 9/1998 | Ilg et al. | 438/758 |
| 5,830,270 A | 11/1998 | McKee et al. | 117/106 |
| 5,835,677 A | 11/1998 | Li et al. | 392/401 |
| 5,855,675 A | 1/1999 | Doering et al. | 118/719 |
| 5,856,219 A | 1/1999 | Naito et al. | 438/241 |
| 5,858,102 A | 1/1999 | Tsai | 118/719 |
| 5,866,213 A | 2/1999 | Foster et al. | 427/573 |
| 5,866,795 A | 2/1999 | Wang et al. | 73/1.36 |
| 5,882,165 A | 3/1999 | Maydan et al. | 414/217 |
| 5,882,413 A | 3/1999 | Beaulieu et al. | 118/719 |
| 5,904,565 A | 5/1999 | Nguyen et al. | 438/687 |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,947,710 A | 9/1999 | Cooper et al. | 418/63 |
| 5,972,430 A | 10/1999 | DiMeo, Jr. et al. | 427/255.32 |
| 6,001,669 A | 12/1999 | Gaines et al. | 438/102 |
| 6,051,286 A | 4/2000 | Zhao et al. | 427/576 |
| 6,062,798 A | 5/2000 | Muka | 414/416 |
| 6,071,808 A | 6/2000 | Merchant et al. | 438/633 |
| 6,084,302 A | 7/2000 | Sandhu | 257/751 |
| 6,086,677 A | 7/2000 | Umotoy et al. | 118/715 |
| 6,110,556 A | 8/2000 | Bang et al. | 428/64.1 |
| 6,117,244 A | 9/2000 | Bang et al. | 118/715 |
| 6,140,237 A | 10/2000 | Chan et al. | 438/687 |
| 6,140,238 A | 10/2000 | Kitch | 438/687 |
| 6,143,659 A | 11/2000 | Leem | 438/688 |
| 6,144,060 A | 11/2000 | Park et al. | 257/310 |
| 6,158,446 A | 12/2000 | Mohindra et al. | 134/25.4 |
| 6,174,377 B1 | 1/2001 | Doering et al. | 118/729 |
| 6,174,809 B1 | 1/2001 | Kang et al. | 438/682 |
| 6,203,613 B1 | 3/2001 | Gates et al. | 117/104 |
| 6,206,967 B1 | 3/2001 | Mak et al. | 118/666 |
| 6,207,302 B1 | 3/2001 | Sugiura et al. | 428/690 |
| 6,248,605 B1 | 6/2001 | Harkonen et al. | 438/29 |
| 6,270,572 B1 | 8/2001 | Kim et al. | 117/93 |
| 6,287,965 B1 | 9/2001 | Kang et al. | 438/648 |
| 6,291,876 B1 | 9/2001 | Stumborg et al. | 257/632 |
| 6,297,539 B1 * | 10/2001 | Ma et al. | 257/410 |
| 6,305,314 B1 | 10/2001 | Sneh et al. | 118/723 R |
| 6,306,216 B1 | 10/2001 | Kim et al. | 118/725 |
| 6,316,098 B1 | 11/2001 | Yitzchaik et al. | 428/339 |
| 6,416,822 B1 * | 7/2002 | Chiang et al. | 427/252 |
| 2001/0000866 A1 | 5/2001 | Sneh et al. | 118/723 R |
| 2001/0009140 A1 | 7/2001 | Bondestam et al. | 118/725 |
| 2001/0011526 A1 | 8/2001 | Doering et al. | 118/729 |
| 2001/0024387 A1 * | 9/2001 | Raaijmakers et al. | 365/200 |
| 2001/0031562 A1 | 10/2001 | Raaijmakers et al. | 438/770 |
| 2001/0034123 A1 | 10/2001 | Jeon et al. | 438/643 |
| 2001/0041250 A1 | 11/2001 | Werkhoven et al. | 428/212 |
| 2001/0042799 A1 | 11/2001 | Kim et al. | 239/553 |
| 2002/0013487 A1 * | 1/2002 | Norman et al. | 556/7 |

FOREIGN PATENT DOCUMENTS

| | | | |
|---|---|---|---|
| EP | 0 429 270 A2 | 5/1991 | G03F/7/36 |
| EP | 0 442 490 A1 | 8/1991 | C30B/25/02 |
| FR | 2 626 110 | 7/1989 | H01L/39/24 |
| FR | 2 692 597 | 12/1993 | C23C/16/00 |
| GB | 2 355 727 | 5/2001 | C23C/16/44 |
| JP | 58-098917 | 6/1983 | H01L/21/205 |
| JP | 58-100419 | 6/1983 | H01L/21/20 |
| JP | 60-065712 A | 4/1985 | C01B/33/113 |
| JP | 61-035847 | 2/1986 | B01J/19/08 |
| JP | 61-210623 | 9/1986 | H01L/21/205 |
| JP | 62-069508 | 3/1987 | H01L/21/203 |
| JP | 62-091495 A | 4/1987 | C30B/25/02 |
| JP | 62-141717 | 6/1987 | H01L/21/203 |
| JP | 62-167297 | 7/1987 | C30B/29/40 |
| JP | 62-171999 | 7/1987 | C30B/29/40 |
| JP | 62-232919 | 10/1987 | H01L/21/205 |
| JP | 63-062313 | 3/1988 | H01L/21/203 |
| JP | 63-085098 | 4/1988 | C30B/21/40 |
| JP | 63-090833 | 4/1988 | H01L/21/365 |
| JP | 63-222420 | 9/1988 | H01L/21/205 |
| JP | 63-222421 | 9/1988 | H01L/21/205 |
| JP | 63-227007 | 9/1988 | H01L/21/205 |
| JP | 63-252420 | 10/1988 | H01L/21/205 |
| JP | 63-266814 | 11/1988 | H01L/21/205 |
| JP | 64-009895 | 1/1989 | C30B/29/40 |
| JP | 64-009896 | 1/1989 | C30B/29/40 |
| JP | 64-009897 | 1/1989 | C30B/29/40 |
| JP | 64-037832 | 2/1989 | H01L/21/205 |
| JP | 64-082615 | 3/1989 | H01L/21/205 |
| JP | 64-082617 | 3/1989 | H01L/21/205 |
| JP | 64-082671 | 3/1989 | H01L/29/78 |
| JP | 64-082676 | 3/1989 | H01L/29/80 |
| JP | 01-103982 | 4/1989 | C30B/23/08 |
| JP | 01-103996 | 4/1989 | C30B/29/40 |
| JP | 64-090524 | 4/1989 | H01L/21/205 |
| JP | 01-117017 | 5/1989 | H01L/21/203 |
| JP | 01-143221 | 6/1989 | H01L/21/314 |
| JP | 01-143233 | 6/1989 | H01L/21/76 |
| JP | 01-154511 | 6/1989 | H01L/21/20 |
| JP | 01-236657 | 9/1989 | H01L/29/80 |
| JP | 01-245512 | 9/1989 | H01L/21/205 |
| JP | 01-264218 | 10/1989 | H01L/21/205 |
| JP | 01-270593 | 10/1989 | C30B/25/02 |
| JP | 01-272108 | 10/1989 | H01L/21/203 |
| JP | 01-290221 | 11/1989 | H01L/21/205 |
| JP | 01-290222 | 11/1989 | H01L/21/205 |
| JP | 01-296673 | 11/1989 | H01L/29/88 |
| JP | 01-303770 | 12/1989 | H01L/39/24 |

| | | | | | | | |
|---|---|---|---|---|---|---|---|
| JP | 01-305894 | 12/1989 | ........... C30B/23/08 | JP | 05-343685 | 12/1993 | ......... H01L/29/784 |
| JP | 01-313927 | 12/1989 | ......... H01L/21/205 | JP | 06-045606 | 2/1994 | ......... H01L/29/784 |
| JP | 02/012814 | 1/1990 | ......... H01L/21/205 | JP | 03-132236 | 5/1994 | ......... H01L/21/205 |
| JP | 02-014513 | 1/1990 | ......... H01L/21/205 | JP | 06-177381 | 6/1994 | ......... H01L/29/784 |
| JP | 02-017634 | 1/1990 | ......... H01L/21/225 | JP | 06-196809 | 7/1994 | ............. H01S/3/18 |
| JP | 02-063115 | 3/1990 | ........... H01L/21/20 | JP | 06-222388 | 8/1994 | ........... G02F/1/136 |
| JP | 02-074029 | 3/1990 | ......... H01L/21/205 | JP | 06-224138 | 8/1994 | ......... H01L/21/205 |
| JP | 02-074587 | 3/1990 | ........... C30B/23/08 | JP | 06-230421 | 8/1994 | ........... G02F/1/136 |
| JP | 02-106822 | 4/1990 | ........... H01B/13/00 | JP | 06-252057 | 9/1994 | ......... H01L/21/205 |
| JP | 02-129913 | 5/1990 | ......... H01L/21/205 | JP | 06-291048 | 10/1994 | ......... H01L/21/205 |
| JP | 02-162717 | 6/1990 | ........... H01L/21/20 | JP | 07-070752 | 3/1995 | ........... C23C/16/40 |
| JP | 02-172895 | 7/1990 | ........... C30B/29/36 | JP | 07-086269 | 3/1995 | ......... H01L/21/314 |
| JP | 02-196092 | 8/1990 | ........... C30B/25/14 | JP | 08-181076 | 7/1996 | ......... H01L/21/205 |
| JP | 02-203517 | 8/1990 | ......... H01L/21/205 | JP | 08-245291 | 9/1996 | ........... C30B/25/14 |
| JP | 02-230690 | 9/1990 | ........... H05B/33/10 | JP | 08-264530 | 10/1996 | ....... H01L/21/3205 |
| JP | 02-230722 | 9/1990 | ......... H01L/21/205 | JP | 09-260786 | 10/1997 | ............. H01S/3/18 |
| JP | 02-246161 | 10/1990 | ......... H01L/29/784 | JP | 09-293681 | 11/1997 | ......... H01L/21/205 |
| JP | 02-264491 | 10/1990 | ............. H01S/3/18 | JP | 10-188840 | 7/1998 | ............. H01J/29/18 |
| JP | 02-283084 | 11/1990 | ............. H01S/3/18 | JP | 10-190128 | 7/1998 | ............. H01S/3/18 |
| JP | 02-304916 | 12/1990 | ......... H01L/21/205 | JP | 10-308283 | 11/1998 | ........... H05B/33/22 |
| JP | 03-019211 | 1/1991 | ......... H01L/21/205 | JP | 11-269652 | 10/1999 | ........... C23C/16/44 |
| JP | 03-022569 | 1/1991 | ......... H01L/29/804 | JP | 2000-031387 | 1/2000 | ........... H01L/27/04 |
| JP | 03-023294 | 1/1991 | ........... C30B/25/18 | JP | 2000-058777 | 2/2000 | ......... H01L/27/108 |
| JP | 03-023299 | 1/1991 | ........... C30B/29/40 | JP | 2000-068072 | 3/2000 | ........... H05B/33/22 |
| JP | 03-044967 | 2/1991 | ........... H01L/29/48 | JP | 2000-087029 | 3/2000 | ........... C09K/11/08 |
| JP | 03-048421 | 3/1991 | ......... H01L/21/302 | JP | 2000-138094 | 5/2000 | ........... H05B/33/10 |
| JP | 03-070124 | 3/1991 | ......... H01L/21/205 | JP | 2000-218445 | 8/2000 | ............. B23P/6/00 |
| JP | 03-185716 | 8/1991 | ......... H01L/21/205 | JP | 2000-319772 | 11/2000 | ........... C23C/14/24 |
| JP | 03-208885 | 9/1991 | ........... C30B/23/02 | JP | 2000-340883 | 12/2000 | ........... H01S/5/125 |
| JP | 03-234025 | 10/1991 | ......... H01L/21/318 | JP | 2000-353666 | 12/2000 | ......... H01L/21/205 |
| JP | 03-286522 | 12/1991 | ......... H01L/21/205 | JP | 2001-020075 | 1/2001 | ........... C23C/16/44 |
| JP | 03-286531 | 12/1991 | ......... H01L/21/316 | JP | 2001-62244 | 3/2001 | ........... B01D/53/34 |
| JP | 04-031391 | 2/1992 | ........... C30B/23/08 | JP | 2001-152339 | 6/2001 | ........... C23C/16/40 |
| JP | 04-031396 A | 2/1992 | ........... C30B/25/14 | JP | 2001-172767 | 6/2001 | ........... C23C/16/40 |
| JP | 04-031396 | 2/1992 | ........... C30B/25/14 | JP | 2001-189312 | 7/2001 | ......... H01L/21/316 |
| JP | 04-100292 | 4/1992 | ............. H01S/3/18 | JP | 2001-217206 | 8/2001 | ......... H01L/21/285 |
| JP | 04-111418 | 4/1992 | ......... H01L/21/205 | JP | 2001-220287 | 8/2001 | ........... C30B/25/02 |
| JP | 04-132214 | 5/1992 | ......... H01L/21/205 | JP | 2001-220294 | 8/2001 | ........... C30B/29/20 |
| JP | 04-132681 | 5/1992 | ........... C30B/25/14 | JP | 2001-240972 | 9/2001 | ......... C23C/16/458 |
| JP | 04/151822 | 5/1992 | ......... H01L/21/205 | JP | 2001-254181 | 9/2001 | ........... C23C/16/46 |
| JP | 04-162418 | 6/1992 | ......... H01L/21/205 | JP | 2001-284042 | 10/2001 | ........... H05B/33/04 |
| JP | 04-175299 | 6/1992 | ........... C30B/29/68 | JP | 2001-303251 | 10/2001 | ........... C23C/16/44 |
| JP | 04-186824 | 7/1992 | ......... H01L/21/205 | JP | 2001-328900 | 11/2001 | ........... C30B/29/68 |
| JP | 04-212411 | 8/1992 | ......... H01L/21/203 | WO | 90/02216 | 3/1990 | ........... C23C/14/34 |
| JP | 04-260696 | 9/1992 | ........... C30B/29/40 | WO | 93/02111 A1 | 2/1993 | ............. C08F/4/78 |
| JP | 04-273120 | 9/1992 | ........... H01L/21/20 | WO | 96/17107 A1 | 6/1996 | ........... C23C/16/44 |
| JP | 04-285167 | 10/1992 | ........... C23C/14/54 | WO | 96/18756 A1 | 6/1996 | ........... C23C/16/08 |
| JP | 04-291916 | 10/1992 | ......... H01L/21/205 | WO | 98/06889 | 2/1998 | |
| JP | 04-325500 | 11/1992 | ........... C30B/33/00 | WO | 98/51838 | 11/1998 | ........... C23C/16/06 |
| JP | 04-328874 | 11/1992 | ......... H01L/29/804 | WO | 99/13504 | 3/1999 | ........... H01L/21/68 |
| JP | 05-029228 | 2/1993 | ......... H01L/21/205 | WO | 99/41423 A2 | 8/1999 | |
| JP | 05-047665 | 2/1993 | ......... H01L/21/205 | WO | 00/11721 | 3/2000 | ........... H01L/29/43 |
| JP | 05-047666 | 2/1993 | ......... H01L/21/205 | WO | 00/15881 A2 | 3/2000 | |
| JP | 05-047668 | 2/1993 | ......... H01L/21/205 | WO | 00/16377 A2 | 3/2000 | |
| JP | 05-074717 | 3/1993 | ......... H01L/21/205 | WO | 00/54320 A1 | 9/2000 | ........... H01L/21/44 |
| JP | 05-074724 | 3/1993 | ......... H01L/21/205 | WO | 00/63957 A1 | 10/2000 | ......... H01L/21/205 |
| JP | 05-102189 | 4/1993 | ......... H01L/21/336 | WO | 00/79019 A1 | 12/2000 | ........... C23C/16/00 |
| JP | 05-160152 | 6/1993 | ......... H01L/21/336 | WO | 00/79576 A1 | 12/2000 | ......... H01L/21/205 |
| JP | 05-175143 | 7/1993 | ......... H01L/21/205 | WO | 01/15220 | 3/2001 | ......... H01L/21/768 |
| JP | 05-175145 | 7/1993 | ......... H01L/21/205 | WO | 01/15220 A1 | 3/2001 | ......... H01L/21/768 |
| JP | 05-182906 | 7/1993 | ........... H01L/21/20 | WO | 01/27346 A1 | 4/2001 | ........... C23C/16/44 |
| JP | 05-186295 | 7/1993 | ........... C30B/25/02 | WO | 01/27347 A1 | 4/2001 | ........... C23C/16/44 |
| JP | 05-206036 | 8/1993 | ......... H01L/21/205 | WO | 01/29280 A1 | 4/2001 | ........... C23C/16/32 |
| JP | 05-234899 | 9/1993 | ......... H01L/21/205 | WO | 01/29891 A1 | 4/2001 | ......... H01L/21/768 |
| JP | 05-235047 | 9/1993 | ......... H01L/21/338 | WO | 01/29893 A1 | 4/2001 | ......... H01L/21/768 |
| JP | 05-251339 | 9/1993 | ........... H01L/21/20 | WO | 01/36702 A1 | 5/2001 | ........... C23C/16/00 |
| JP | 05-270997 | 10/1993 | ........... C30B/29/68 | WO | 01/40541 A1 | 6/2001 | ........... C23C/16/40 |
| JP | 05-283336 | 10/1993 | ........... H01L/21/20 | WO | 01/66832 A2 | 9/2001 | ........... C30B/16/44 |
| JP | 05-291152 | 11/1993 | ......... H01L/21/205 | | | | |
| JP | 05-304334 | 11/1993 | ............. H01L/3/18 | | | | |
| JP | 05-343327 | 12/1993 | ......... H01L/21/205 | | | | |

OTHER PUBLICATIONS

Klaus, et al., "Atomic Layer Deposition of $SiO_2$ Using Catalyzed and Uncatalyzed Self–Limiting Surface Reactions", *Surface Review & Letters,* 6(3&4) (1999), pp. 435–448.

Yamaguchi, et al., "Atomic–layer chemical–vapor–deposition of silicon dioxide films with extremely low hydrogen content", *Appl. Surf. Sci.,* vol. 130–132 (1988), pp. 202–207.

George, et al., "Surface Chemistry for Atomic Layer Growth", *J. Phys. Chem.,* vol. 100 (1996), pp. 13121–131.

George, et al., "Atomic layer controlled deposition of $SiO_2$ and $Al_2O_3$ using ABAB . . . binary reaction sequence chemistry", *Appl. Surf. Sci.,* vol. 82/83 (1994), pp. 460–467.

Wise, et al., "Diethyldiethoxysilane as a new precursor for $SiO_2$ growth on silicon", *Mat. Res. Soc. Symp. Proc.,* vol. 334 (1994), pp. 37–43.

Niinisto, et al., "Synthesis of oxide thin films and overlayers by atomic layer epitaxy for advanced applications", *Mat. Sci. & Eng.,* vol. B41 (1996), pp. 23–29.

Ritala, et al., "Perfectly conformal TiN and $Al_2O_3$ films deposited by atomic layer deposition", *Chemical Vapor Deposition,* vol. 5(1) (Jan. 1999), pp. 7–9.

Min, et al., "Atomic layer deposition of TiN thin films by sequential introduction of Ti precursor and NH/sub3/", Symp.: *Advanced Interconnects and Contact Materials and Processes for Future Integrated Circuits* (Apr. 13–16, 1988), pp. 337–342.

Klaus, et al., "Atomic Layer Deposition of Tungsten using Sequential Surface Chemistry with a Sacrificial Stripping Reaction," Thin Solid Films 360 (2000), pp. 145–153, (Accepted Nov. 16, 1999).

Min, et al., "Metal–Organic Atomic–Layer Deposition of Titanium–Silicon–Nitride Films", *Applied Physics Letters,* American Inst. Of Physics, vol. 75(11) (Sep. 13, 1999).

Martensson, et al., "Atomic Layer Epitaxy of Copper on Tantalum", *Chemical Vapor Deposition,* 3(1) (Feb. 1, 1997), pp. 45–50.

Klaus, et al., "Atomically controlled growth of tungsten and tungsten nitride using sequential surface reactions". *Appl. Surf. Sci.,* vol. 162–163 (2000), pp. 479–491.

Ritala, et al. "Atomic Layer Epitaxy Growth of TiN Thin Films", *J. Electrochem. Soc.,* 142(8) (Aug. 1995), pp. 2731–737.

Elers, et al., "NbC15 as a precursor in atomic layer epitaxy", *Appl. Surf. Sci.,* vol. 82/83 (1994), pp. 468–474.

Lee, "The Preparation of Titanium–Based Thin Film by CVD Using Titanium Chlorides as Precursors", *Chemical Vapor Deposition,* 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/H2 Process", *J. Electrochem. Soc.,* 145(8) (Aug. 1998), pp. 2926–2931.

Min, et al., "Chemical Vapor Depostion of Ti–Si–N Films with Alternating Source Supply", *Mat. Res. Soc. Symp. Proc.,* vol. 564 (Apr. 5, 1999), pp. 207–210.

Bedair, "Atomic layer epitaxy deposition processes", *J. Vac. Sci. Techol.* 12(1) (Jan./Feb. 1994).

Yamaga, et al., "Atomic layer epitaxy of ZnS by a new gas supplying system in a low–pressure metalorganic vapor phase epitaxy", *J. of Crystal Growth* 117 (1992), pp. 152–155.

Elam, et al., "Nucleation and growth during tungsten atomic layer deposition on $SiO_2$ surfaces," Thin Solid Films 386 (2001) pp. 41–52, (Accepted Dec. 14, 2000).

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low–temperature deposition of titanium nitride films from dialkylhydrazine–based precursors", Materials Science in Semiconductor Processing 2 (1999), pp. 149–157.

Suzuki, et al., "A 0.2 µm contact filing by 450° C.–hydrazine–reduced TiN film with low resistivity", IEDM 92–979, pp. 11.8.1–11.8.3.

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some β–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition/ Epitaxy Aluminum Oxide Plasma, dated Oct. 2, 2001.

NERAC Search abstract of "Atomic Layer Deposition of Ta and Ti for Interconnect Diffusion Barriers", by Rossnagel, et al., J. Vac. Sci. & Tech., 18(4) (Jul. 2000).

Abstracts of articles re atomic layer deposition and semiconductors and copper.

NERAC search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10) (Oct. 1991), pp. 3062–3067.

"Applications of Integrated processing", Solid State Technology, US, Cowan Pub., vol. 37, No. 12 (Dec. 1, 1994), pp. 45–47.

"Cluster Tools for Fabrication of Advanced devices" Jap. J. of Applied Physics, Extended Abstracts, 22 [nd] Conference Solid State Devices and Materials (1990), pp. 849–852.

Kitigawa, et al., "Hydrogen–mediated low temperature epitaxy of Si in plasma–enhanced chemical vapor deposition", Applied Surface Science (2000), pp. 30–34.

* cited by examiner

PROCESS CONDITIONS AND PRECURSORS FOR ATOMIC LAYER DEPOSITION (ALD) OF $Al_2O_3$

BACKGROUND OF THE INVENTION

1. Field of the Invention

This invention relates to semiconductor processing. More particularly, this invention relates to a method of sequential deposition of high-K $Al_2O_3$ films on a substrate.

2. Description of the Related Art

The semiconductor industry continues to strive for larger production yields while increasing the uniformity of layers deposited on substrates having increasingly larger surface areas. These same factors in combination with new materials also provide higher integration of circuits per unit area of the substrate. High-K dielectrics are an example of new materials currently investigated. These materials are being investigated as a potential replacement for $SiO_2$ as both gate and DRAM dielectrics. The present and future requirements for $SiO_2$ in MOS structures relate to thicknesses<5 nm. The equivalent thicknesses may be achieved with higher K materials physically thicker than the $SiO_2$ layers. The choice of suitable high-K dielectrics is typically directed to materials with relatively large band gaps and high dielectric constants. The band gap of $Al_2O_3$ is 9 eV, which is considerably larger than that of most high-K materials and comparable to that of $SiO_2$. Also, the dielectric constant of $Al_2O_3$ is 9, which is more than two times greater than that of $SiO_2$. Therefore, $Al_2O_3$ is a suitable high-K replacement for $SiO_2$.

As circuit integration increases, the need for greater uniformity and process control regarding layer thickness rises. As a result, various technologies have been developed to deposit layers on substrates in a cost-effective manner, while maintaining control over the characteristics of the layer. Chemical Vapor Deposition (CVD) is a common deposition process employed for depositing layers on a substrate. CVD is a flux-dependent deposition technique that requires precise control of the substrate temperature and precursors introduced into the processing chamber in order to produce a desired layer of uniform thickness. These requirements become more critical as substrate size increases, creating a need for more complexity in chamber design and fluid flow technique to maintain adequate uniformity.

Another deposition process that demonstrates superior step coverage is a sequential deposition technique known as Atomic Layer Deposition (ALD). ALD has steps of chemisorption that deposit monolayers of reactive precursor molecules on a substrate surface. A drawback with ALD of $Al_2O_3$ films is that the deposition rate is much lower than conventional CVD methodologies, in part, because many of the precursors employed are highly viscous or solid. This increases the time required to introduce the precursors into a processing chamber and, thus, processing time.

Thus, a need exists, to provide an improved technique to form $Al_2O_3$ films employing sequential deposition techniques, such as Atomic Layer Deposition.

SUMMARY OF THE INVENTION

Disclosed is a method and apparatus for depositing high-K $Al_2O_3$ films on a substrate disposed in a processing chamber employing liquid precursors having low viscosity. In this manner, the time required to form an $Al_2O_3$ film using ALD techniques is reduced. The method features sequential flow of aluminum and oxygen precursors into the processing chamber. To that end, the aluminum precursor is chemisorbed onto the wafer surface when it flows into the processing chamber. The non-chemisorbed aluminum precursor is then purged from the processing chamber, followed by introduction of the oxygen precursor. The oxygen precursor reacts with the chemisorbed layer, creating a monolayer of $Al_2O_3$. Finally, excess oxygen precursor and by-products of the reaction are purged from the processing chamber completing an ALD cycle. To obtain the desired film thickness, multiple ALD cycles are repeated. The apparatus includes features that carryout the steps of the method.

DETAILED DESCRIPTION OF THE INVENTION

Figure 1:
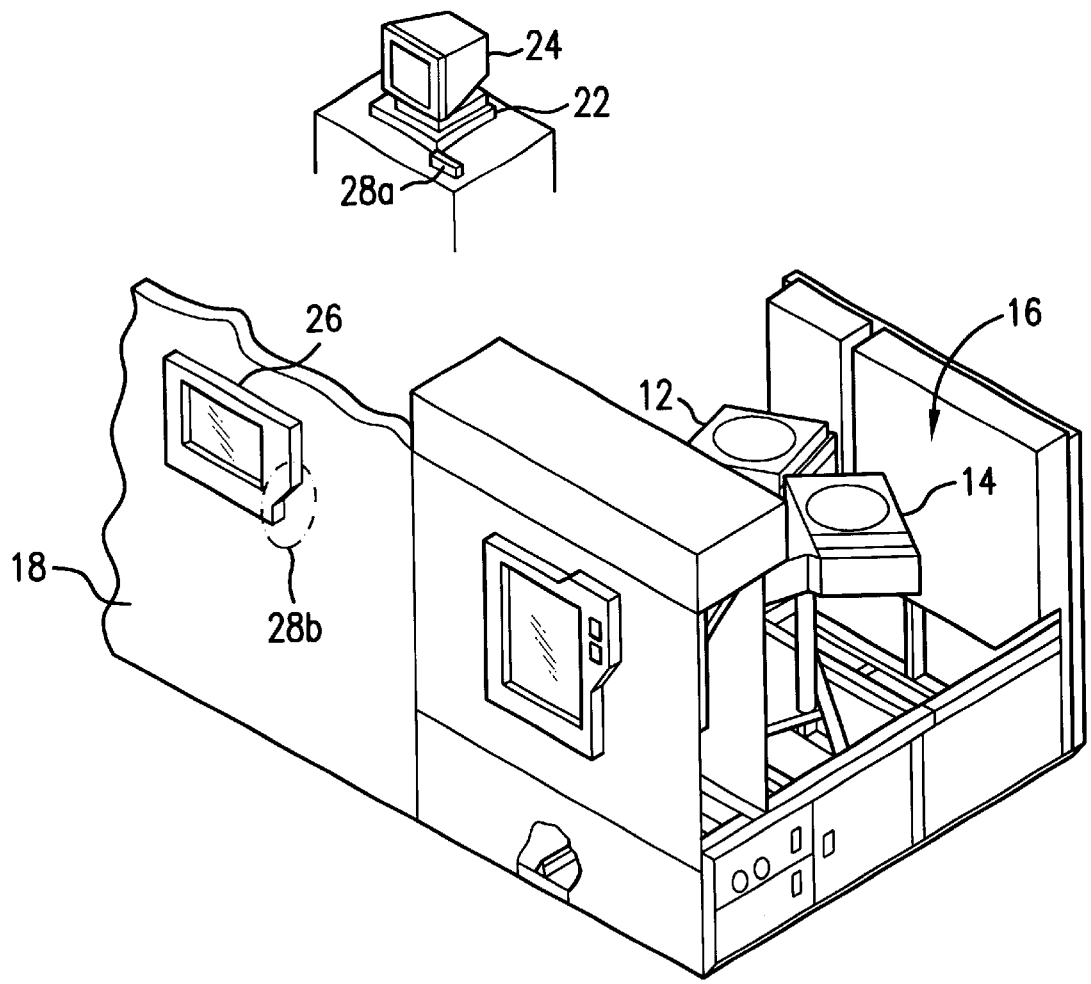
FIG. 1 is a perspective view of a semiconductor processing system in accordance with the present invention.

Referring to FIG. 1, an exemplary wafer processing system includes one or more process systems 12 and 14 disposed in a common work area 16 surrounded by a wall 18. Process systems 12 and 14 are in data communication with a controller 22 that is connected to one or more monitors, shown as 24 and 26. Monitors 24 and 26 typically display common information concerning the process associated with the process systems 12 and 14. Monitor 26 is mounted to the wall 18, with monitor 24 being disposed in the work area 16. Operational control of process systems 12 and 14 may be achieved with use of a light pen, associated with one of monitors 24 and 26, to communicate with controller 22. For example, a light pen 28a is associated with monitor 24 and facilitates communication with the controller 22 through monitor 24. A light pen 28b facilitates communication with controller 22 through monitor 26.

Figure 2:
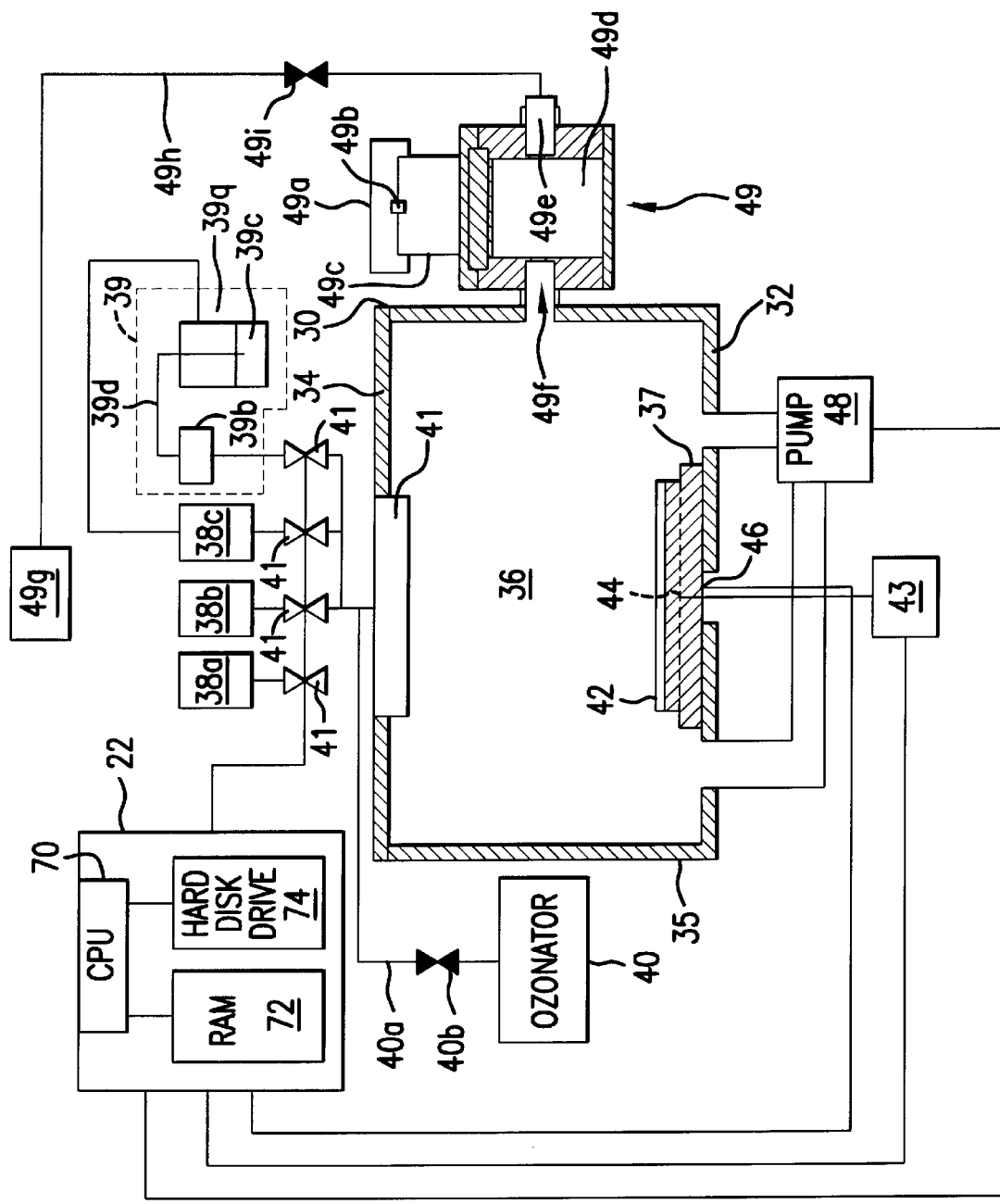
FIG. 2 is a detailed view of processing chambers shown above in FIG. 1.

Referring to both FIGS. 1 and 2, each of process systems 12 and 14 includes a housing 30 having a base wall 32, a cover 34, disposed opposite to the base wall 32, and a sidewall 35, extending therebetween. Housing 30 defines a chamber 36. A pedestal 37 is disposed within processing chamber 36 to support a substrate 42. Pedestal 37 may be mounted to move between the cover 34 and base wall 32, using a displacement mechanism (not shown), but is typically fixed proximate to bottom wall 32. Supplies of processing fluids 38a, 38b, 38c, 39 and 40 are in fluid communication with the processing chamber 36 via a manifold 34a. Process fluid supply 39 consists of a liquid injection assembly having an ampoule 39a in fluid communication with a vaporizer 39b. Ampoule 39a includes a supply of a liquid precursor 39c and is in fluid communication with supply 38c, which contains a carrier gas. Ampoule 39a is in fluid communication with vaporizer 39b via precursor channel 39d to deliver, to processing chamber 36, precursor 39c, with the aid of carrier gas in supply 38c. Ampoule 39a, liquid 39c and channel 39d may be heated by conventional heating methods, e.g., heating tape (not shown). Process fluid supply 40 is an ozonator that produces ozone, which is introduced into processing chamber 36 over ozone channel 40a and is regulated by valve 40b. Regulation of the flow of gases from supplies 38a, 38b, 38c and 39 is effectuated via flow valves 41.

Depending on the specific process, substrate 42 may be heated to a desired temperature prior to layer deposition via a heater embedded within pedestal 37. For example, pedestal 37 may be resistively heated by applying an electric current from an AC power supply 43 to a heater element 44. Substrate 42 is, in turn, heated by pedestal 37, and can be maintained within a desired process temperature range. The actual temperature, however, is dependent upon the gases employed and the topography of the surface upon which deposition is to occur. A temperature sensor 46, such as a thermocouple, is also embedded in wafer support pedestal 37 to monitor the temperature of pedestal 37 in a conventional manner. For example, the measured temperature may be used in a feedback loop to control the electrical current applied to heater element 44 by the power supply 43, such that the wafer temperature can be maintained or controlled at a desired temperature that is suitable for the particular process application. Pedestal 37 is optionally heated using radiant heat (not shown). A vacuum pump 48 is used to evacuate processing chamber 36 and to help maintain the proper gas flows and pressure inside processing chamber 36.

Referring to both FIGS. 1 and 2, for processes requiring a plasma, one or more of process systems 12 and 14 include a remote plasma source 49. Although virtually any remote plasma source may be included, an exemplary remote plasma source 49 includes a microwave source 49a, such as a magnetron, coupled via an antenna 49b to a waveguide system 49c, and a plasma applicator 49d. Defining a volume therein, plasma applicator 49d includes a gas inlet 49e and an outlet 49f. Gas inlet 49e may be coupled to a gas source, such as source 49g via a supply line 49h having a valve 49i to control the rate of gas input to gas inlet 49e from gas source 49g.

Figure 3:
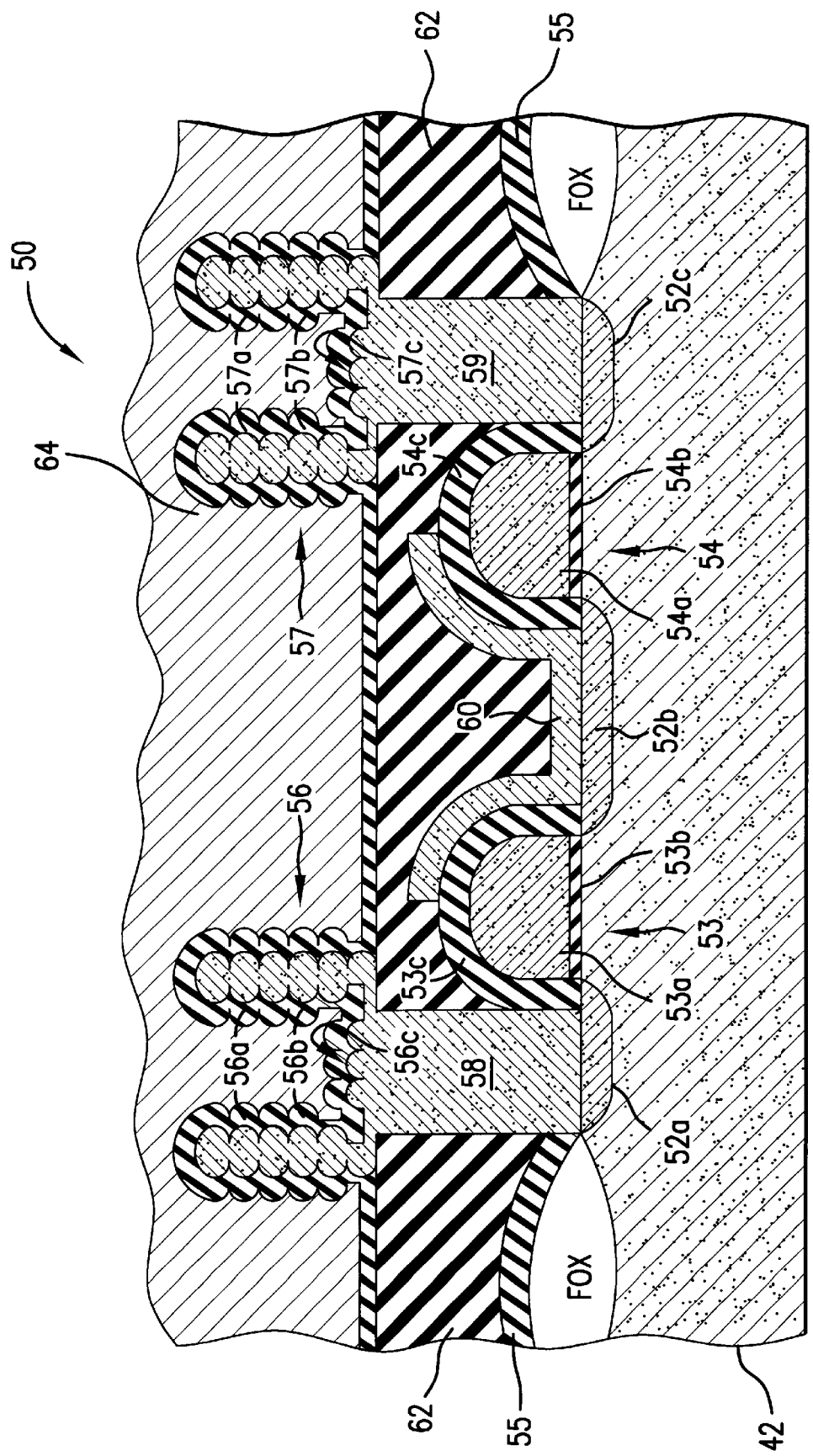
FIG. 3 is a detailed cross-sectional view of a memory cell formed on a substrate shown in FIG. 2.

Referring to FIGS. 1 and 3, one of process systems 12 and 14, discussed above may operate to form, on substrate 42, a layer of $Al_2O_3$ in accordance with the present invention. For exemplary purposes, the present invention is discussed with respect use of $Al_2O_3$ as a dielectric layers during the fabrication of memory devices.

An exemplary memory device includes a DRAM memory cell 50 shown as being defined between two spaced-apart field oxide regions, FOX, that may be formed on the substrate employing any known technique, such as a LOCOS technique. Formed into substrate 42 between field oxide regions FOX are a plurality of spaced-apart diffusion regions 52a, 52b and 52c. Gate structures 53 and 54 are disposed between adjacent diffusion regions 52a, 52b and 52c and include a gate electrode 53a and 54a with gate dielectric 53b and 54b being disposed between gate electrode 53a and 54a and substrate 42. Disposed adjacent to each gate electrode 53a and 54a is an insulating layer 53c and 54c that may be formed from silicon nitride. An insulating layer 55 is also dispersed adjacent to field oxide regions FOX. A pair of storage capacitors 56 and 57 are included, each of which is in electrical communication with one of the diffusion regions 52a and 52c, respectively. To that end, a polysilicon plug 58 and 59 extends from one of these diffusion regions and connects to storage capacitors 56 and 57, respectively. A conductive layer extends from diffusion region 52b toward storage capacitors 56 and 57, forming a bit line electrode 60. A layer 62 of silicon oxide is disposed between storage capacitors 56 and 57 and silicon nitride layers 53c, 54c and 55 and bit line electrode 60.

As shown, each storage capacitor 56 and 57 is formed from a pair of spaced-apart polysilicon silicon spacers 56a and 57a that are formed with hemispherical grain polysilicon. This increases the surface area of capacitor 56 and 57 due to the rough and bumped surface that results from this layer, effectively increasing the capacitance of the same. Blanketing spacers 56a and 57a is a dielectric layer 56b and 57b. A conductive layer 64 is disposed adjacent to dielectric layers 56b and 57b to complete formation of storage cell capacitors 56 and 57. Conductive layer 64 may be formed from virtually any conductive material, such as tungsten titanium-nitride of doped polysilicon.

Figure 4:
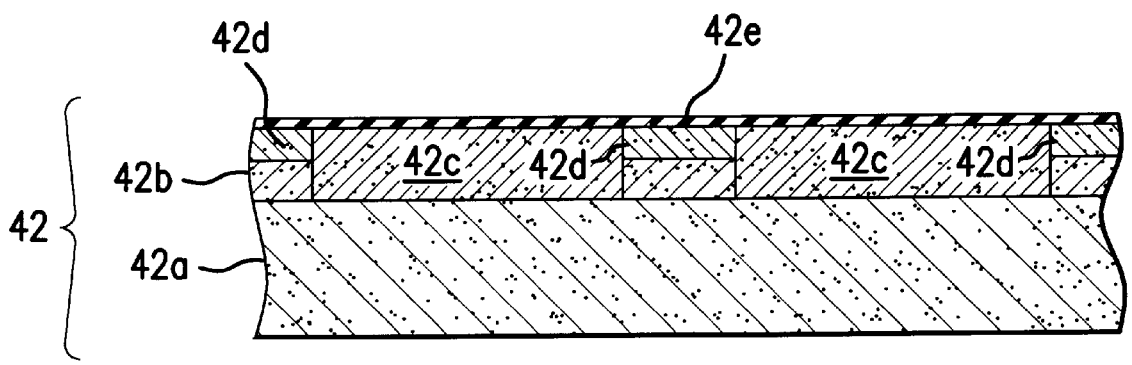
FIG. 4 is a detailed cross-sectional view of the substrate shown in FIG. 3 during formation of a dielectric layer that will eventually become a gate dielectric layer for transistors associated with the memory cell shown in FIG. 3.
Figure 5:
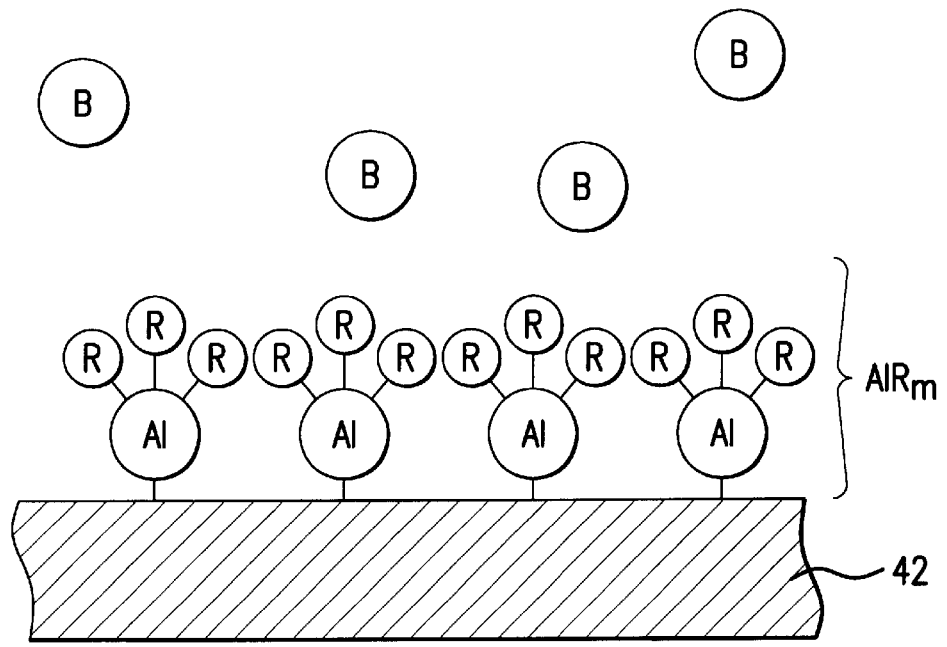
FIG. 5 is a schematic view showing deposition of a first molecule onto a substrate using sequential deposition techniques in accordance with one embodiment of the present invention.
Figure 6:
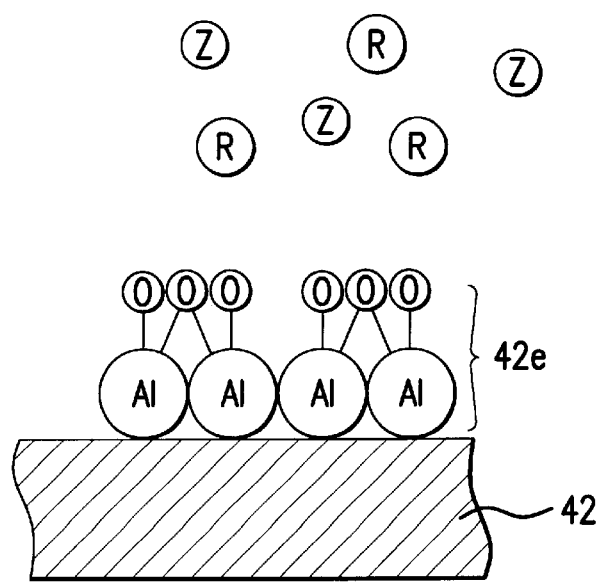
FIG. 6 is a schematic view showing formation of an $Al_2O_3$ layer during deposition of second molecule onto a substrate in accordance with one embodiment of the present invention.

Referring to both FIGS. 3 and 4, with respect to formation of gate dielectric 53b and 54b, substrate 42 typically includes a wafer 42a that may be formed from any material suitable for semiconductor processing, such as silicon. One or more layers, shown as layer 42b, may be deposited on wafer 42a. Layer 42b is formed from p-epitaxial silicon that includes doped regions 42c, separated by shallow trench isolation regions 42d made employing standard processing techniques. Doped regions 42c may be either n-type or p-type, depending upon the desired application.

Formed adjacent to layer 42b is dielectric layer 42e. In the present example, layer 42e is formed from, $Al_2O_3$, by sequentially exposing substrate 42 to processing gases to chemisorb monolayers of differing compounds onto substrate 42, discussed more fully below.

Referring to FIGS. 2 and 5–7, in the present example layer 42e is formed on substrate 42 employing sequential deposition techniques and using an aluminum-containing precursor consisting of $AlR_m$, where R is a ligand and m is an integer, and an oxygen-containing precursor B. Specifically, the initial surface of substrate 42 presents an active ligand to precursor $AlR_m$.

Once the processing pressure and deposition temperature have been established, a carrier gas is introduced into processing chamber 36 during time $t_1$ before the $AlR_m$ is flowed into processing chamber 36. Specifically, an inert carrier gas is flowed into process chamber 36 during time $t_1$, for approximately 5 to 8 seconds. The carrier gas is selected from a set of inert gases including Ar, $He_2$ and $N_2$. During time $t_2$, $AlR_m$ precursor is introduced into processing chamber 36 to produce a monolayer $AlR_m$ on substrate 42 via chemisorption reaction. Typically, $AlR_m$ precursor is introduced into processing chamber 36 along with the carrier gas for approximately 0.8 to 1.5 seconds during time $t_2$. After $t_2$ has lapsed, the flow of $AlR_m$ process gas terminates, and the flow of the carrier gas continues during time $t_3$, purging processing chamber 36 of $AlR_m$ precursor and by-products of the chemisorption reaction. This lasts for approximately 5 to 8 seconds.

After $t_3$ has lapsed, the flow of the carrier gas terminates, and the flow of the oxygen-containing precursor B is introduced into processing chamber 36 during time $t_4$ to chemisorb oxygen into the $AlR_m$ layer. Specifically, the R ligand present on layer $AlR_m$ reacts with precursor B so that oxygen is chemisorbed into layers $AlR_m$. To that end, the oxygen-containing precursor is introduced into processing chamber 36 for approximately 1 to 3 seconds, during time $t_4$. This releases ligands, R, as well as by-products, z, which move away from substrate 42, thereby concluding one cycle of the sequential deposition technique in accordance with the present invention. In this manner layer 42e consists of a mono-molecular layer of $Al_2O_3$.

The flow of precursor B into processing chamber 36 is subsequently terminated. After the flow of precursor B terminates, a flow of the carrier gas may be repeated as discussed with respect to $t_1$ which purges processing chamber 36 of precursor B, ligands, R, and by-products of the chemisorption of oxygen reaction. The aforementioned cycles $t_2$, $t_3$ and $t_4$ may be repeated multiple times until $Al_2O_3$ layer 42e reaches a desired thickness. After $Al_2O_3$ layer 42e reaches a desired thickness, subsequent processing may occur to form, for example, gate dielectric layers 53b and 54b of gate structures 53 and 54 using standard deposition techniques. The advantage of employing sequential deposition techniques to form gate dielectric layers 53b and 54b is that precise control of the gate dielectric thickness and width may be achieved.

Formation of an $Al_2O_3$ layer in this manner is particularly advantageous when creating dielectric layers 56b and 57b for storage capacitor 56 and 57, respectively. As shown, spaced-apart spacers 56a and 57a are covered with hemispherical grain polysilicon, which has a rough, or bumped, surface. Such a surface is very difficult to blanket with a conformal dielectric layer. Depositing a conformal layer is further exacerbated by the aspect ratio of the void defined by either spacers 56a or 57a and a nadir 56c and 57c, respectively. The void defined by these features may provide an aspect ratio of as great as 30:1. However, formation of layers 56b and 57b by sequential deposition of an $Al_2O_3$ results in the formation of a highly conformal dielectric layer over spacers 56a and 57a.

Figure 8:
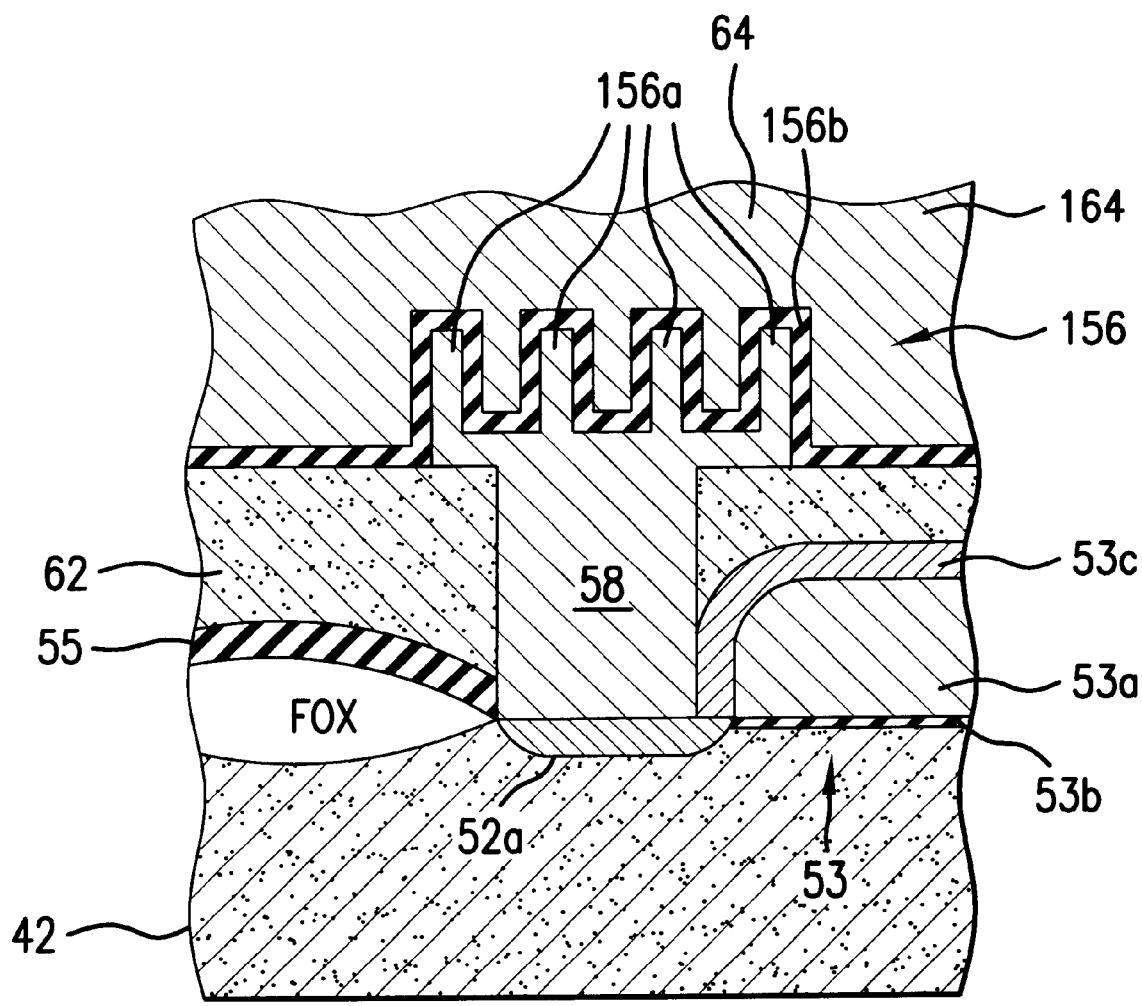
FIG. 8 is a detailed cross-sectional view of an alternate embodiment of a storage capacitor shown in FIG. 3.
Figure 9:
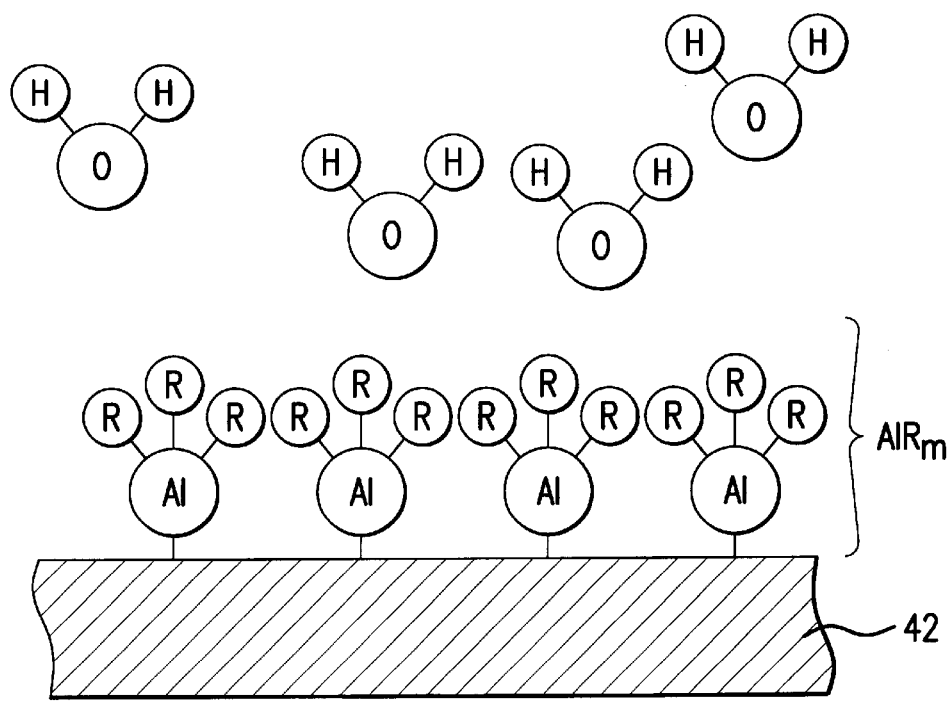
FIG. 9 is a schematic view showing deposition of a first molecule onto a substrate during sequential deposition techniques in accordance with one embodiment of the present invention.
Figure 10:
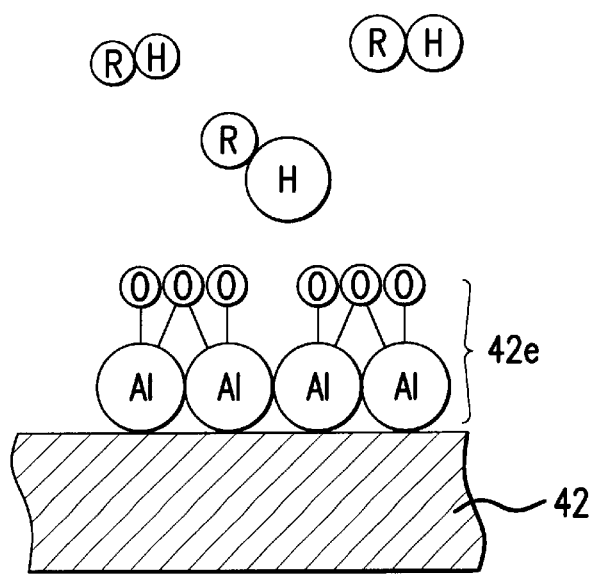
FIG. 10 is a schematic view showing formation of an $Al_2O_3$ layer during deposition of second molecule onto a substrate in accordance with one embodiment of the present invention.

An alternate embodiment of the storage capacitors 56 and 57 that may be fabricated in accordance with the present invention is shown in FIG. 8 as crown storage cell capacitor 156. Crown capacitor 156 includes a plurality of spaced-apart polysilicon spacers 156a. A serpentine dielectric layer 156b disposed adjacent to spacers 156a, with a conductive layer 164 disposed to blanket dielectric layer 156b. This configuration increases the surface area of storage capacitor 156, effectively increasing the capacitance per unit volume of the memory cell. Forming dielectric layer 156b from $Al_2O_3$ with the present invention is advantageous, because of the conformableness of the same. As a result dielectric layer 156b may be disposed adjacent to spacers 156a having aspect ratios as high as 30:1, while still providing adequate step coverage.

Figure 7:
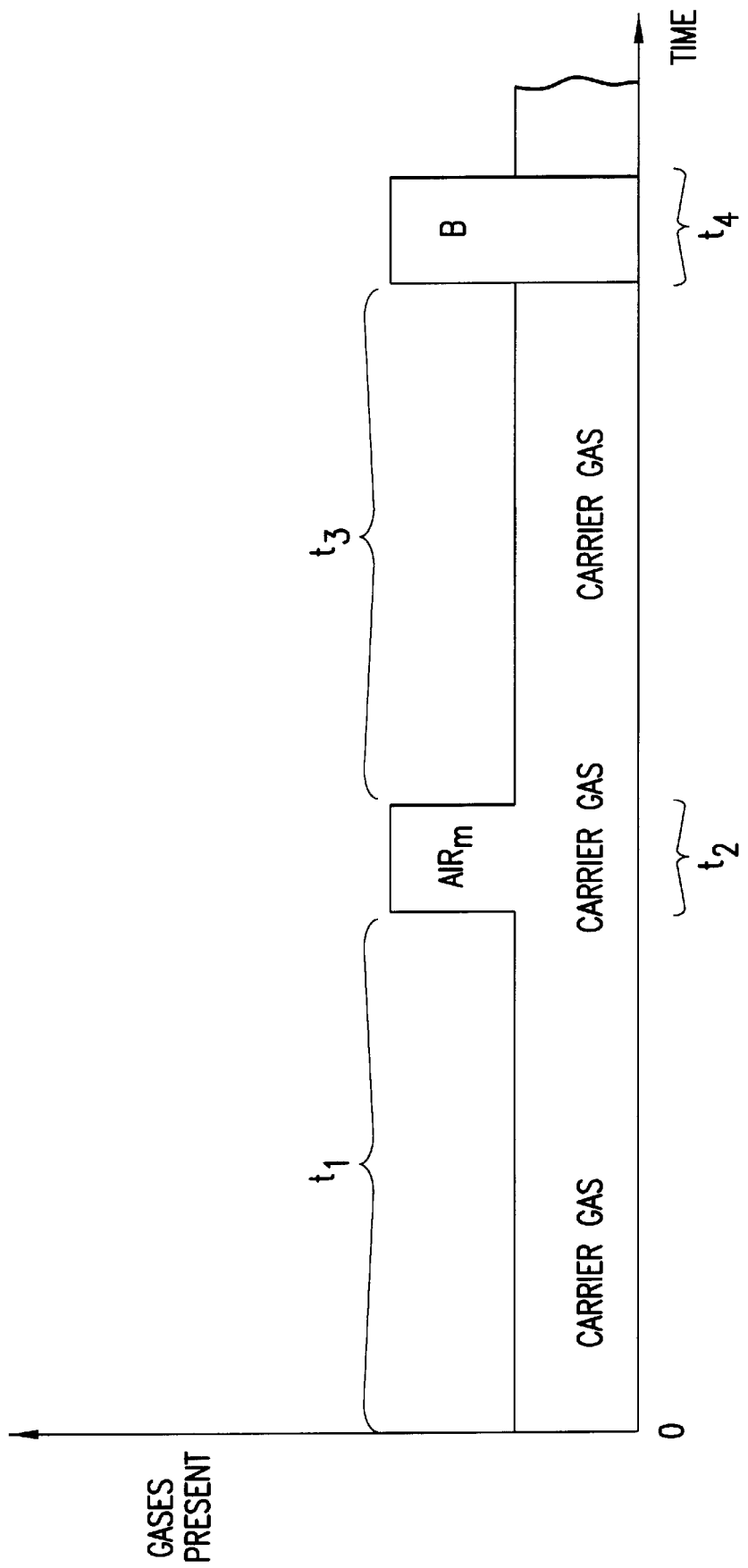
FIG. 7 is a graphical representation showing the concentration of gases introduced into the processing chamber shown in FIG. 2, and the time in which the gases are present in the processing chamber to deposit the $Al_2O_3$ layer shown above in FIG. 4, in accordance with one embodiment of the present invention.

Referring to FIGS. 2, 4 and 7, one example of precursor $AlR_m$ is formed by sublimation of a fluid aluminum-containing compound, Triisopropoxyaluminum, and the oxygen-containing precursor B is selected from a set consisting of ozone and oxygen radicals. To that end, precursor $AlR_m$ is prepared in ampoule 39a by dissolving Triisopropoxyaluminum a Hexane solution to produce a weight ratio of Triisopropoxyaluminum to Hexane that is between 10:90 to 60:40. The use of Triisopropoxyaluminum is beneficial, because it is a nonpyrophoric, resulting in a relative safe compound. However, Triisopropoxyaluminum is a solid making the same difficult to deliver into processing chamber 36 in an efficient manner. The use of hexane is advantageous, because it reduces Triisopropoxyaluminum to provide precursor $AlR_m$ with a viscosity that is less than water, i.e., the precursor is a low viscosity fluid. For purposes of the present invention, low viscosity is defined as a viscosity lower than water. By providing precursor $AlR_m$ with low viscosity, injection system 39 may more rapidly inject precursor $AlR_m$ into processing chamber 36, thereby reducing the time required to form layer 42e.

The chamber pressure is established to be in a range of 0.1 to 6 Torr, inclusive. The substrate temperature is in the range of 150° C. to 500° C., inclusive. Once the processing pressure and deposition temperature have been reached, the carrier gas is introduced during time $t_1$. The Triisopropoxyaluminum:Hexane solution is introduced into the processing chamber 36, flowing at a flow rate between 1 to 200 mg/min during time $t_2$. In this manner, layer $AlR_m$ is deposited as a mono-molecular layer of Triisopropoxyaluminum:Hexane by a chemisorption reaction. Thereafter, a carrier gas consisting of Argon, Helium or Nitrogen enters processing chamber 36 during time $t_3$ to purge the non-deposited Triisopropoxyaluminum:Hexane solution that remains therein, as well as the by-products of the chemisorption reaction.

During time $t_4$, either oxygen radicals or ozone is flowed into processing chamber as precursor B. The choice of which oxygen-containing precursor to employ is dependent upon many factors, including the topology of the underlying layer. For example, oxygen radicals are chemically more reactive than ozone, resulting in a given volume of oxygen radicals reacting more quickly with the aluminum-containing precursor in layer $AlR_m$ than the same volume of ozone. However, the relative reactive lifetime of oxygen radicals is short, compared to ozone, after which time the radicals combine with an adjacent radical forming a less active oxygen molecule. As a result, ozone may be preferred for applications requiring formation of an $Al_2O_3$ layer on features, such as the roughened topology of spacers 56a and 57a having an aspect ratios as great as 30:1, shown in FIG. 3. Often, the oxygen radicals recombine before reaching nadir 56c and 57c. This has a tendency to create voids and result in other defects in resulting layer 56b and 57b. A similar situation is present should the oxygen radicals be required to travel long distances over substrate 42 before reacting with the aluminum-containing layer, e.g. 300 mm or larger area glass substrates such as those used for flat-panel displays. One manner in which to reduce recombination of oxygen radicals is to position remote plasma source 49 on cover 34 so as to shorten the distance between remote plasma source 49 and substrate 42. However, it should be understood that remote plasma source 49 may be mounted anywhere desired.

Referring to both FIGS. 3 and 4, ozone overcomes many of the drawbacks of oxygen radical and affords high conformableness with low defects for features having aspect ratios as high as 30:1. This results from the relatively long reactivity life of ozone, compared to that of oxygen radicals.

In addition, ozone is quite useful when having to travel long distances over substrate 42 before reacting with layer $AlR_m$.

Referring to FIGS. 2, 4 and 7 were oxygen radicals employed as the oxygen-containing precursor, it may be activated by remote plasma source 49. To that end, oxygen gas from supply 49g would be flowed into applicator 49d. Microwave source 49a would generate microwave energy at power levels between 100W and 3000W. The microwave energy would propagate through waveguide 49c and into applicator 49d, dissociating oxygen molecules into a plurality of reactive radicals. The reactive radicals would flow through outlet 49f and into processing chamber 36. In this manner, the oxygen radicals or ions react with the Triisopropoxyaluminum:Hexane monolayer 42e to form a monolayer of $Al_2O_3$. At this point, an ALD cycle is complete and a surface comprising a monolayer of $Al_2O_3$ remains upon substrate 42. Were ozone employed as the oxygen-containing precursor, ozone would be introduced into processing chamber 36 at a rate of 300–3000 sccm.

An alternate precursor chemistry for sequential deposition of $Al_2O_3$ films in accordance with the present invention includes a liquid aluminum-containing precursor consisting of a Triisopropoxyaluminum and Tetrahydrofuran solution prepared in ampoule 39a at a weight ratio of Triisopropoxyaluminum to Tetrahydrofuran that is between 10:90 to 60:40 to form a low viscosity aluminum-containing precursor. As before, the oxygen-containing precursor is selected from a set consisting of ozone and oxygen radicals, the choice of which is based upon, inter alia, the topology of substrate 42. The use of Tetrahydrofuran is advantageous, because it reduces Triisopropoxyaluminum to a fluid to provide precursor $AlR_m$ with a viscosity that is less than water. As discussed above, this reduces the time required to deposit an aluminum-containing layer.

The chamber pressure is established to be in a range of 0.1 to 6 Torr, inclusive. The substrate temperature is in the range of 150° C. to 300° C., inclusive. Once the processing pressure and deposition temperature have been reached, the carrier gas is introduced during time $t_1$. The Triisopropoxyaluminum:Tetrahydrofuran solution is introduced into the processing chamber 36, flowing at a flow rate between 1 to 200 mg/min during time $t_2$. In this manner, a monolayer of Triisopropoxyaluminum:Tetrahydrofuran is deposited on substrate 42 by a chemisorption reaction. Thereafter, a carrier gas consisting of Argon, Helium or Nitrogen enters processing chamber 36 during time $t_3$ to purge the non-deposited Triisopropoxyaluminum:Tetrahydrofuran solution that remains therein, as well as the by-products of the chemisorption reaction. This is followed by termination of the flow of the carrier gas and introduction of an oxygen-containing precursor during time $t_4$. Were ozone employed as the oxygen-containing precursor, ozone would be introduced into processing chamber 36 at a rate of 300–3000 sccm.

Were oxygen radicals employed as the oxygen-containing precursor, then oxygen gas would be flowed into applicator 49d of remote plasma source 49. Microwave source 49a would generate microwave energy at power levels between 100W and 3000W. The microwave energy would propagate through waveguide 49c and into applicator 49c, dissociating oxygen molecules into a plurality of reactive radicals. The reactive radicals would flow through outlet 49f and into processing chamber 36. In this manner, the oxygen radicals or ions react with the Triisopropoxyaluminum:Tetrahydrofuran monolayer present on substrate 42 to chemisorb oxygen into the monolayer. At this point, an ALD cycle is complete and a surface comprising a monolayer of $Al_2O_3$ remains upon substrate 42.

Additional alternate precursor chemistries for sequential deposition of $Al_2O_3$ films in accordance with the present invention include a liquid aluminum-containing precursor consisting of a solution of Dimethylaluminumhydride and dimethylethylamine, or a solution of Ethylpiperidine and Dimethylaluminumhydride. Unlike Triisopropoxyaluminum, Dimethylaluminumhydride is pyrophoric, but was found to be easily converted to a nonpyrophoric low viscosity fluid by mixing with either Dimethylethylamine or Ethylpiperidine. To that end, Dimethylaluminumhydride is mixed in ampoule 39a at a weight ratio between 10:90 to 60:40 of Dimethylaluminumhydride to either Dimethylethylamine or Ethylpiperidine. The oxygen-containing precursor is selected from a set consisting of ozone and oxygen radicals, the choice being dependent upon, inter alia, substrate 42 topology, as discussed above.

The chamber pressure is established to be in a range of 0.1 to 4 Torr, inclusive. The substrate temperature is in the range of 100° C. to 300° C., inclusive. Once the processing pressure and deposition temperature have been reached, the carrier gas is introduced during time $t_1$. The Dimethylaluminumhydride:dimethylethylamine or Ethylpiperidine:Dimethylaluminumhydride solution is introduced into the processing chamber 36, flowing at a flow rate between 1 to 200 mg/min during time $t_2$. In this manner, a monolayer of either Dimethylaluminumhydride:Dimethylethylamine or Ethylpiperidine:Dimethylaluminumhydride is deposited on substrate 42 by a chemisorption reaction. Thereafter, a carrier gas consisting of Argon, Helium or Nitrogen enters processing chamber 36 during time $t_3$ to purge the non-deposited Dimethylaluminumhydride:Dimethylethylamine or Ethylpiperidine:Dimethylaluminumhydride solution that remains therein, as well as the by-products of the chemisorption reaction. This is followed by termination of the flow of the inert gas and introduction of an oxygen-containing precursor during time $t_4$. Were ozone employed as the oxygen-containing precursor, ozone would be introduced into processing chamber 36 at a rate of 300–3000 sccm.

Were oxygen radicals employed as the oxygen-containing precursor, then oxygen gas would be flowed into applicator 49d of remote plasma source 49. Microwave source 49a would generate microwave energy at power levels between 100W and 3000W. The microwave energy would propagate through waveguide 49c and into applicator 49c, dissociating oxygen molecules into a plurality of reactive radicals. The reactive radicals would flow through outlet 49f and into processing chamber 36. In this manner, the oxygen in the oxygen-precursor reacts with the monolayer present of substrate 42 to chemisorb oxygen therein. At this point, an ALD cycle is complete and a surface comprising a monolayer of $Al_2O_3$ remains upon substrate 42.

In yet another embodiment of the present invention, an inexpensive oxygen-containing precursor, $Bb_y$, is substituted for precursor B, discussed above with respect to FIGS. 5, 6 and 7. The oxygen precursor $Bb_y$ consists of $H_2O$, shown more clearly in FIG. 8.

Referring to FIGS. 2 and 7–9, aluminum-containing precursor $AlR_m$ consists of solid $AlCl_3$ that is contained in ampoule 39a. The chamber pressure is established to be in a range of 0.1 to 500 Torr, inclusive. The substrate temperature is in the range of 100° C. to 300° C., inclusive. Taking advantage of the low sublimation temperature of $AlCl_3$, the ampoule 39a is heated to approximately 190° C., vaporizing the $AlCl_3$ to form a low viscosity fluid. Once the processing pressure and deposition temperature have been reached, the carrier gas is introduced during time $t_1$. The $AlCl_3$ precursor is introduced into processing chamber 36, flowing at a flow rate between 20–1000 sccm during time $t_2$.

As discussed above, the initial surface of substrate 42 presents an active ligand to the $AlCl_3$ precursor, resulting in layer $AlR_m$ consisting of $AlCl_3$, with the $Cl_3$ exposed to the processing chamber 36. Thereafter, a carrier gas consisting of Argon, Helium or Nitrogen enters processing chamber 36 during time $t_3$ to purge the non-deposited $AlCl_3$ precursor that remains therein and by-products of the chemisorption reaction. This is followed by termination of the flow of the carrier gas and introduction of the oxygen-containing precursor at time $t_4$. During time $t_4$, vaporized $H_2O$ is introduced into processing chamber 36 at a rate of 300–3000 sccm. The vaporized $H_2O$ may be introduced as steam through a steam line (not shown). The $AlCl_3$ reacts with the $H_2O$, releasing HCL and $Cl_2$ molecules that move away from substrate 42 and are subsequently pumped from processing chamber 36, leaving a monolayer of $Al_2O_3$. Specifically, oxygen contained in the water vapor reacts with the $AlCl_3$ monolayer, disposed on substrate 42, to chemisorb oxygen therein. At this point, a sequential deposition cycle is complete and a surface comprising monolayer 42e of $Al_2O_3$ remains upon substrate 42. The process proceeds cycle after cycle, until the desired thickness is achieved.

Water is also employed as the oxygen-containing precursor $Bb_y$, in conjunction with either of the solutions of Dimethylaluminumhydride and Dimethylethylamine, or of Ethylpiperidine and Dimethylaluminumhydride, which are prepared as discussed above. To that end, the process conditions mentioned above are employed, with water vapor being flowed into processing chamber 36, in place of either oxygen radicals or ozone and at a rate of 2000 sccm.

Referring to FIGS. 2 and 4, the afore-described processes for depositing the $Al_2O_3$ layer 42e may be controlled using a computer program product that is executed by the controller 22. To that end, the controller 22 includes a central processing unit (CPU) 70, a volatile memory, such as a random access memory (RAM) 72 and permanent storage media, such as a floppy disk drive for use with a floppy diskette, or hard disk drive 74. The computer program code can be written in any conventional computer readable programming language; for example, 68000 assembly language, C, C++, Pascal, Fortran, and the like. Suitable program code is entered into a single file, or multiple files, using a conventional text editor and stored or embodied in a computer-readable medium, such as the hard disk drive 74. If the entered code text is in a high level language, the code is compiled and the resultant compiler code is then linked with an object code of precompiled Windows® library routines. To execute the linked and compiled object code the system user invokes the object code, causing the CPU 70 to load the code in RAM 72. The CPU 70 then reads and executes the code to perform the tasks identified in the program.

Although the invention has been described in terms of specific embodiments, one skilled in the art will recognize that various changes to the reaction conditions, i.e., temperature, pressure, film thickness and the like can be substituted and are meant to be included herein and sequence of gases being deposited. For example, sequential deposition process may have a different initial sequence. The initial sequence may include exposing the substrate the oxygen-containing precursor before the aluminum-containing precursor is introduced into the processing chamber. Additionally, removal of precursors and by-products from the processing chamber may occur by concurrently pumping the processing chamber and flowing a carrier gas therein. In this manner, temperature and pressure fluctuations may be minimized. Further, the oxygen precursor has been discussed with respect to the oxygen radical-ozone molecule dichotomy. It is feasible, however, to employ either molecular oxygen or ozone radicals, as well. Therefore, the scope of the invention should not be based upon the foregoing description. Rather, the scope of the invention should be determined based upon the claims recited herein, including the full scope of equivalents thereof.

What is claimed is:

1. A method for depositing an aluminum-containing layer on a substrate disposed in a processing chamber, said method comprising:

forming an aluminum-containing monolayer upon said substrate by flowing an aluminum-containing compound and a liquid solvent into a vaporizer and then delivering the aluminum-containing process gas onto said substrate;

reacting oxygen with said aluminum-containing monolayer by exposing said aluminum-containing monolayer to an oxygen-containing precursor to produce a layer of $Al_2O_3$; and repeating forming said aluminum-containing layer and reacting oxygen with said aluminum-containing monolayer to form said layer of $Al_2O_3$ with a desired thickness.

2. The method as recited in claim 1 wherein forming said aluminum-containing monolayer further includes vaporizing a liquid aluminum-containing precursor selected from the set of precursors consisting essentially of Triisopropoxyaluminum-Tetrahydrofuran, Aluminumtrichloride, Dimethylaluminumhydride:Dimethylethylamine and Ethylpiperidine:Dimethylaluminumhydride and reacting oxygen further includes vaporizing water to produce said oxygen-containing precursor.

3. The method as recited in claim 1 wherein forming said aluminum-containing monolayer further includes vaporizing a liquid aluminum-containing precursor selected from the set of precursors consisting essentially of Triisopropoxyaluminum-Hexane, Triisopropoxyaluminum-Tetrahydrofuran, Dimethylaluminumhydride:Dimethylethylamine and Ethylpiperidine:Dimethylaluminumhydride, by flowing said liquid aluminum-containing precursor into a vaporizer.

4. The method as recited in claim 1 wherein reacting oxygen further includes flowing an oxygen-containing compound, selected from a set of compounds consisting essentially of ozone, water vapor, oxygen radical and oxygen ions into said processing chamber.

5. The method as recited in claim 1 wherein forming said aluminum-containing monolayer further includes heating said substrate to a temperature in a range of 100° C. to 500° C., inclusive and establishing a pressure within said processing chamber to be in a range of 0.1 Torr to 500 Torr.

6. The method as recited in claim 1 wherein forming said aluminum-containing monolayer further includes vaporizing a liquid Triisopropoxyaluminum-Hexane having a weight ratio of Triisopropoxyaluminum to Hexane in a range of 10:90 to 60:40, by flowing said liquid Triisopropoxyaluminum-Hexane into a vaporizer.

7. The method as recited in claim 1 wherein forming said aluminum-containing monolayer further includes vaporizing a liquid Triisopropoxyaluminum-Tetrahydrofuran having a weight ratio of Triisopropoxyaluminum to Tetrahydrofuran in a range of 10:90 to 60:40, by flowing said liquid Triisopropoxyaluminum-Tetrahydrofuran into a vaporizer.

8. The method as recited in claim 1 wherein forming an aluminum-containing monolayer upon said substrate further includes flowing said aluminum-containing process gas into said processing chamber at a rate in a range of 1 mg/minute to 200 mg/minute, inclusive.

9. The method as recited in claim 1 wherein forming said aluminum-containing monolayer further includes vaporizing a liquid aluminum-containing precursor by heating liquid Aluminumtrhichloride to a temperature above a sublimation temperature that is associated with said liquid Aluminumtrichloride to produce Aluminumtrichloride gas and introducing said Aluminumtrichloride gas into said processing chamber at a rate in a range of 20 sccm to 1000 sccm, inclusive.

10. The method as recited in claim 1 wherein reacting oxygen further includes dissociating an oxygen-containing gas to form reactive species by impinging microwave frequencies on said oxygen-containing gas in a range of 100 Watts to 3000 Watts, and flowing said reactive species over said substrate.

11. The method as recited in claim 1 further including purging, after forming said aluminum-containing layer, said processing chamber of said aluminum-containing process gas before reacting oxygen with said aluminum-containing monolayer, and removing, after reacting oxygen and before repeating forming said aluminum-containing layer, said oxygen-containing precursor from said processing chamber.

12. The method of claim 1, wherein the aluminum-containing compound and the liquid solvent are flowed into the vaporizer in a weight ratio between about 10:90 and about 60:40.

13. A method for depositing an aluminum-containing layer onto a substrate disposed in a processing chamber, said method comprising:

heating said substrate to a temperature in a range of 100° C. to 500° C., inclusive;

establishing a pressure within said processing chamber in a range of 0.1 Torr to 500 Torr;

forming an aluminum-containing monolayer upon said substrate by flowing an aluminum-containing compound and a liquid solvent into a vaporizer and then delivering the aluminum-containing process gas onto said substrate;

reacting oxygen with said aluminum-containing monolayer by exposing said aluminum-containing monolayer to an oxygen-containing precursor to produce a layer of $Al_2O_3$ and by-products; and repeating forming said aluminum-containing layer and reacting oxygen with said aluminum-containing monolayer to form said layer of $Al_2O_3$ with a desired thickness.

14. The method as recited in claim 13 wherein heating said substrate further includes heating said substrate to a processing temperature no less than 150° C. and forming said aluminum-containing monolayer further includes vaporizing a liquid aluminum-containing precursor selected from the set of precursors consisting essentially of Triisopropoxyaluminum-Hexane and Triisopropoxyaluminum-Tetrahydrofuran, by flowing said liquid aluminum-containing precursor into a vaporizer and reacting oxygen further includes flowing an oxygen-containing compound, selected from a set of compounds consisting essentially of ozone, oxygen radical and oxygen, ions into said processing chamber.

15. The method as recited in claim 13 wherein heating said substrate furthering includes heating said substrate to a processing temperature having a range no greater than 300° C. and, forming said aluminum-containing monolayer further includes vaporizing a liquid aluminum-containing precursor selected from the set of precursors consisting essentially of Triisopropoxyaluminum-Tetrahydrofuran, Dimethylaluminumhydride:Dimethylethylamine and Ethylpiperidine:Dimethylaluminumhydride and reacting oxygen further Includes flowing an oxygen-containing compound, selected from a set of compounds consisting essentially of water vapor, ozone, oxygen radicals and oxygen ions into said processing chamber.

16. The method as recited in claim 13 wherein heating said substrate furthering includes heating said substrate to a processing temperature having a range of 100° C. to 300° C., inclusive and forming said aluminum-containing monolayer further includes vaporizing a liquid aluminum-containing precursor selected from the set of precursors consisting essentially of, Aluminumtrichloride, Dimethylaluminumhydride:Dimethylethylamine and Ethylpiperidine:Dimethylaluminumhydride and reacting oxygen further includes flowing water vapor into said processing chamber.

17. The method as recited in claim 13 further including purging, after forming said aluminum-containing layer, said processing chamber of said aluminum-containing process gas before reacting oxygen into said aluminum-containing monolayer, and removing, after reacting oxygen and before repeating forming said aluminum-containing layer, said oxygen-containing precursor from said processing chamber.

18. The method of claim 13, wherein the aluminum-containing compound and the liquid solvent are flowed into the vaporizer in a weight ratio between about 10:90 and about 60:40.

19. A processing system for forming an aluminum-containing layer on a substrate, said system comprising:

a body defining a processing chamber;

a cover disposed over the body and adapted to deliver gases into the processing chamber;

a holder disposed within said processing chamber to support said substrate;

an oxygen-containing precursor source mounted on the cover;

an aluminum-containing precursor in fluid communication with the cover;

a temperature control system in thermal communication with said processing chamber;

a pressure control system in fluid communication with said processing chamber;

a controller in electrical communication with the cover, said temperature control system, and said pressure control system; and a memory in data communication with said controller, said memory comprising a computer-readable medium having a computer-readable program embodied therein, said computer-readable program including a first set of instructions for controlling the cover, said pressure control system and said temperature control system to form an aluminum-containing monolayer upon said substrate by chemisorption of said aluminum-containing precursor, and a second set of instructions to control said gas delivery system, said pressure control system and said temperature control system to chemisorb oxygen into said aluminum-containing monolayer by exposing said aluminum-containing monolayer to said oxygen-containing precursor to produce a layer of $Al_2O_3$ and by-products, and a third set of instructions to control the cover, said pressure control system and said temperature control system to repeat forming said aluminum-containing layer and chemisorbing oxygen into said aluminum-containing monolayer to form said layer of $Al_2O_3$ with a desired thickness.

20. The system as recited in claim 19 wherein said computer-readable program further includes a fourth set of instructions to control the cover to purge said aluminum-containing precursor and by-products from said processing chamber before introduction of said oxygen-containing precursor into said processing chamber and a fifth set of instructions to remove said oxygen-containing precursor after chemisorbing said oxygen into said aluminum-containing monolayer and before execution of said third set of instructions.

21. The processing system of claim 19, wherein the oxygen-containing precursor source comprises a remote plasma source.

* * * * *